United States Patent [19]

Manger et al.

[11] 4,304,843

[45] Dec. 8, 1981

[54] DRY TONER WITH IMPROVED TONING UNIFORMITY

[75] Inventors: Charles W. Manger, Middletown; Michael G. Fickes, Matawan; John W. Long, Freehold, all of N.J.

[73] Assignee: E. I. Du Pont de Nemours and Company, Wilmington, Del.

[21] Appl. No.: 91,889

[22] Filed: Nov. 7, 1979

Related U.S. Application Data

[63] Continuation of Ser. No. 963,083, Nov. 22, 1978, Pat. No. 4,215,193.

[51] Int. Cl.³ .............................................. G03C 5/24
[52] U.S. Cl. .................................. 430/331; 430/109; 430/111; 430/291
[58] Field of Search ............... 430/109, 111, 291, 331, 430/144, 137

[56] References Cited

U.S. PATENT DOCUMENTS

| | | | |
|---|---|---|---|
| 3,236,776 | 2/1966 | Tomanek | 430/111 |
| 3,620,726 | 11/1971 | Chu et al. | 430/291 |
| 3,637,385 | 1/1972 | Hayes et al. | 430/291 |
| 3,754,912 | 8/1973 | Jones et al. | 430/291 |
| 3,847,886 | 11/1974 | Blunt | 430/137 |
| 3,909,282 | 9/1975 | Gray | 430/291 |
| 3,969,251 | 7/1976 | Jones | 430/111 |
| 3,970,571 | 7/1976 | Olson et al. | 430/137 |
| 4,142,981 | 3/1979 | Bean et al. | 430/111 |
| 4,142,982 | 3/1979 | Yamakami et al. | 430/109 |

OTHER PUBLICATIONS

Goel, N. et al., *Xerox Disclosure Bulletin*, vol. 2, No. 5, 9/1977, p. 13.
Pond, S., *Xerox Disclosure Bulletin*, vol. 2, No. 5, 9/1977, p. 17.

*Primary Examiner*—Charles L. Bowers, Jr.

[57] ABSTRACT

Toner particles of an intimate mixture of 25 to 75% by weight of substantially colorless, inert, nonelectroscopic spheroidal-shape polymer particles of size distribution in the range of greater than 5 to less than 60 $\mu$m, not more than 15% of the polymer particles being less than 10 $\mu$m or greater than 50 $\mu$m equivalent spherical diameter, and 75 to 25% by weight of colorant particles having a size distribution within the range of 0.2 to 30 $\mu$m and not more than 50% of the colorant particles being less than 1 $\mu$m particle size. Ionic copolymer spheroidal particles are preferred. The toner particles are useful for color development of tacky areas by depositing and distributing the toner particles by means of a pad, including an applicator apparatus comprising a housing for toner, a free moving weight in the housing for agitating the toner, means to release toner from the housing, and at least two hinged pads mounted on the housing.

7 Claims, No Drawings

DRY TONER WITH IMPROVED TONING UNIFORMITY

This is a continuation of application Ser. No. 963,083 filed Nov. 22, 1978, now U.S. Pat. No. 4,215,193.

DESCRIPTION

1. Technical Field

This invention relates to new dry toners.

2. Background Art

Reproduction processes are known wherein photohardenable elements comprising a base support bearing a photohardenable layer are exposed imagewise through an original forming nontacky and tacky image areas. The image is made visible (developed) by toning with a suitable toner which adheres only in the tacky image areas. Excess toner is removed from the nontacky image areas to provide, for example, an image which is a proof of the original or which can be used to transfer the image to another surface.

Various toners and applicators for applying the toners have been developed. Typical prior art toners are described in Chu and Manger U.S. Pat. No. 3,620,726 and mixtures using these toners are described in Gray U.S. Pat. No. 3,909,282. Applicators for applying these toners to a tacky surface include pads dipped in toners, rotating and/or oscillating brushes, etc. In these applicators, the amount of toner adhered to the tacky surface tends to vary, depending on the delivery rate and method of distribution over the surface. To simplify the application, Sandner developed a hand-operated toner applicator apparatus which is the subject of U.S. Pat. No. 4,019,821. It was found, however, that when the prior art toners were used in the Sandner toner apparatus for toning tacky areas, various problems occurred, e.g., a streaked and mottled image was obtained. A mottled image is one that is nonuniform in appearance. In addition, the known toners caked and were not freeflowing in the toner apparatus.

An object of the invention is to provide new dry toners which when applied to a tacky surface will produce streak-free, nonmottled images.

DISCLOSURE OF THE INVENTION

In accordance with this invention there is provided toner particles consisting essentially of an intimate mixture of (A) 25 to 75% by weight of substantially colorless, inert, nonelectroscopic, spheroidal shape polymer particles having size distribution in the range of greater than 5 to less than 60 micrometers, not more than 15% of the polymer particles being less than 10 micrometers and not more than 15% of the polymer particles being greater than 50 micrometers of equivalent-spherical diameter the polymer particles being selected from the class consisting of polymethylmethacrylate, polyethylmethacrylate, polyethylene, polyvinyl chloride and ionic copolymer of $\alpha$-olefins having the formula $R-CH=CH_2$ where R is a radical selected from the class consisting of hydrogen, alkyl of 1 to 8 carbon atoms, and $\alpha,\beta$-ethylenically carboxylic acid having from 3 to 8 carbon atoms, the copolymers having from 10% to 90% of the carboxylic acid groups ionized by neutralization with metal ions uniformly distributed throughout the copolymer, and (B) 75 to 25% by weight of colorant particles having a size distribution within the range of 0.2 to 30 micrometers and not more than 50 percent of the colorant particles being less than 1 micrometer particle size.

In practicing the invention, a photohardenable element useful in an image reproduction process of the type disclosed in Chu et al U.S. Pat. No. 3,649,268 may be used. Positive toned images are obtained using these photohardenable elements. Other systems known to those skilled in the art can be used provided that tacky and nontacky image areas are formed thereby. The tacky and nontacky image areas in these systems can be formed either directly, e.g., by exposure to actinic radiation, or by treatment with solutions, heat or other means to obtain tacky image areas. Also useful in the invention are negative toned images, i.e., those image areas wherein the exposed image areas are tacky, formed from the elements described in Abele, Grossa and Pilz German Application No. P 27 58 209.8, filed Dec. 27, 1977 and Cohen and Fan U.S. application Ser. No. 915,063 filed June 12, 1978, now U.S. Pat. No. 4,174,216.

After formation of the tacky image areas, the element is placed in a processing tray or on a flat table top or some other convenient surface. The tacky image areas are then treated with the improved toner particles by means of a pad, e.g., fabric pile. Preferably, the toners are dispensed from a toner applicator apparatus described in U.S. Pat. No. 4,019,821. Basically, the toner applicator apparatus comprises a housing (upright walls) for containment of toner, at least one free moving weight within the housing for agitating the toner, means to release toner from the housing, and at least two hinged pads mounted on the housing and located beneath the housing. The pads are applicator pad members which form the bottom wall of the housing. Translation means is provided to open and close the housing thereby releasing toner onto the tacky image areas to be developed. The pad members which can have a soft fabric pile or an electrostatically flocked foam rubber surface, are hingedly mounted on the housing to facilitate application of the released toner to the image areas upon functional movement of the apparatus over the tacky surface. Preferably the toner is applied in the form of a mound and is distributed over the tacky surface by movement with at least one pad member of the apparatus. A manually operable bar on the side of the housing can be present to move the pads apart from each other thereby permitting toner to flow onto the tacky surface. A preferred method of distributing the toner over the tacky surface is described in Sandner U.S. Pat. No. 4,087,279. Any excess toner is removed by wiping the excess off the surface by means of a brush, lamb's wood pad, acrylic, deep pile fabric pad or cloth. Vacuum can also be used.

The toner which gives improved results consists essentially of an intimate mixture of (A) substantially colorless, inert, spheroidal shape polymer particles having size distribution in the range of greater than 5 to less than 60 micrometers, not more than 15% of the polymer particles being less than 10 micrometers and not more than 15% of the polymer particles being greater than 50 micrometers of equivalent spherical diameter, and (B) colorant particles having a size distribution within the range of 0.2 to 30 micrometers and not more than 50% of the colorant particles being less than 1 micrometer particle size. The spheroidal shape polymer particles are present in an amount of 25 to 75% by weight and the colorant particles in an amount of 75 to 25% by weight.

A preferred toner will contain 50% by weight of colorant and 50% by weight of polymer particles.

The term "particle size" as used herein with respect to the colorant covers the size distribution of the smallest, independently acting unit which is called upon to discriminate between the exposed and unexposed areas of the imaging layer. For the purpose of determining whether such a particle has the preferred particle size distribution these particles can be measured, for example, by a Coulter Counter, Coulter Electronics, Inc., Hialeah, Fla.

Spheroidal shape polymer particles of many types are useful in the toner mixture provided that the particles are substantially colorless and inert within the stated size distribution range. Preferably the particles are also nonelectroscopic, i.e., being neither repelled from nor attracted to a charged rod placed in proximity to the particles. Examples of specific particles include polymethylmethacrylate, polyethylmethacrylate, polyethylene, cellulose acetate, polyvinyl chloride, ionic copolymers of α-olefins having the formula R—CH=CH$_2$ where R is a radical selected from the class consisting of hydrogen, alkyl of 1 to 8 carbon atoms, and α,β-ethylenically carboxylic acids having from 3 to 8 carbon atoms, the copolymers having from 10% to 90% of the carboxylic acid groups ionized by neutralization with metal ions uniformly distributed throughout the copolymer. The preferred ionic copolymers are described in Rees U.S. Pat. No. 3,264,272. A preferred average particle size for the ionic copolymer particle is about 23 micrometers wherein not more than about 10% of the particles are less than 10 micrometers and not more than about 1% of the particles are greater than 50 micrometers. As illustrated in Example 6a and 6b, the particles must be substantially spheroidal within the size distribution range. Particles of various other shapes within the size distribution range are not functional in the toner applicator apparatus.

The other component of the toner mixture is the colorant particles. The colorant particles which have the required size distribution range are described in Chu and Manger U.S. Pat. No. 3,620,726. Useful colorants include:

(1) Dye in solid solution in a matrix particle (The particle may have to be dry ground to get proper effective particle size), e.g., Lumigraphic Red X-2489, Lumigraphic Green X-2523, etc.; and (2) Finely dispersed pigment crystallites in a resin matrix ground to proper effective particle size. Resin matrices include, e.g., polyvinyl chloride, cellulose acetate, cellulose acetate butyrate, polystyrene, polymethylmethacrylate, etc. Preferably the colorant particles are surface treated with a polysiloxane compound, e.g., dimethylpolysiloxane. Generally this is accomplished by blending the particular toner with the polysiloxane in a blender. The spheroidal shape polymer particles are then blended with the surface-treated toner particles. A preferred size distribution range of the colorant particles is 0.5 to 5 micrometers.

Best Mode for Carrying Out the Invention

The best mode is illustrated in Example 1 wherein a toner particle mixture is prepared by blending a polysiloxane-treated toner with an equal amount of ionic hydrocarbon polymer. A photopolymerizable surface containing tacky and nontacky image areas is toned with the toner using the toner applicator apparatus disclosed in U.S. Pat. No. 4,019,821.

Industrial Applicability

The toners of the invention are extremely useful in the toner applicator apparatus of U.S. Pat. No. 4,019,821 when used to form toned images on tacky image areas, preferably those tacky areas resulting from the imagewise exposure of photohardenable elements as described in U.S. Pat. No. 3,649,268. Color proofs are achieved with the toner applicator apparatus which substantially eliminates streaks and mottle. The toners of the invention can also be used for application directly onto tacky surfaces.

EXAMPLES

The following examples illustrate the invention.

EXAMPLE 1

The following ingredients are used in the preparation of a cyan toner:

| Ingredient | Amount (g) |
|---|---|
| Monastral ® Blue G (Copper Phthalocyanine, Pigment Blue 15 C.I. #74160) | 1,064.0 |
| Monastral ® Green G (Pigment Green 7, C.I. #74260) | 943.0 |
| Cellulose Acetate | 7,981.0 |
| Acetone | 27,669.6 |
| Water | 22,680.0 |
| Dimethylpolysiloxane, 574.0 g/10 kg of toner (200 Fluid-100 CS, Dow Corning Co., Midland, Mich.) | |

The water and acetone are thoroughly mixed and are charged to a Type 30-S Attritor stirred ball mill (Union Process Co., Akron, Ohio). This mill contains ⅛ inch (0.049 cm.) Type 440 stainless steel balls that are agitated at 150 rpm. A nitrogen atmosphere is maintained in the mill during the mixing procedure. Approximately two-thirds of the weight of the cellulose acetate is then added during a 3 to 5 minute period and is agitated in the liquid for about 2 minutes. The pigments are then added over a 2 minute period followed by the remainder of the cellulose acetate. The mixture is then agitated at about 150 rpm in the mill for about 6 hours; the mill is drained and washed with water; and the combined effluents are filtered to collect the wet toner. The wet toner is water-washed and dried in an oven at 115°–125° C., and the dried toner is pulverized in a hammer mill in combination with dry ice to keep the pulverized toner flowing through the screens of the hammer mill. The particle size distribution of the toner at this point is 0.2 to 30 micrometers with not more than 50% of the particles less than 1 micron equivalent spherical diameter. The resultant toner is then surface treated by blending with the dimethylpolysiloxane in a Patterson-Kelley Twin-shell ® blender. This is the control toner noted below.

A sample of the toner prepared as described above is blended with an equal weight of an ionic hydrocarbon polymer beads Surlyn ® 5000, E. I. du Pont de Nemours and Co. having an average particle size of 23 μm in a conventional table-top blender (e.g. Osterizer ® or Waring ® blenders), so that an intimate mixture is obtained.

A photopolymerizable element similar to that of Example 1, U.S. Pat. No. 3,649,268 is prepared having a 0.0003 inch (~0.00076 cm) photopolymer layer coated on 0.0005 inch (~0.0013 cm) polyethylene terephthalate film support, and covered by a suitable 0.00075 inch (~0.0019 cm) polypropylene cover sheet. As described in Example 1 of U.S. Pat. No. 3,649,268, the cover sheet is removed and the photopolymer layer is laminated to Kromekote ® paper (cast on coated side). A suitable solid test pattern image is exposed on the photopolymer whereby the exposed areas become hardened and the unexposed areas remain tacky. The polyethylene terephthalate film is then removed and the image is developed by toning using the toning applicator as described in Sandner, U.S. Pat. No. 4,019,821. When the toner of this invention is used, the image has no appreciable mottle or streaks, while the control toner left a streaked and mottled image.

order to achieve a multicolor image. The "tents" are intolerable deformities made when the photopolymer layer is laminated over the image layer. Beads which produced this defect are subsequently passed through a suitable sieve to attain the correct particle size and the sieved version is tested with the results shown below. In these examples, results shown as "poor" indicate a streaked or mottled image or the proliferation of "tents" when subsequent image-forming layers are applied. "Good" or "excellent" results indicate good or excellent image quality with no appreciable streaks or mottle and an absence of "tents":

| Example | Bead Type | Approx. Particle Size Range[1] | | | Results |
|---|---|---|---|---|---|
| | | % <10μm | Avg. (μm) | % >50μm | |
| 3a | polymethylmethacrylate (PMMA), Rohm & Haas Co., unsieved | | too many particles larger than 100μm | | poor |
| 3b | Same as 3a, sieved | 15 | 18 (sieved fraction <62μm) | 8 | excellent |
| 3c | PMMA, Rohm & Haas Co., Acryloid ® K-147, unsieved | | too many particles larger than 100μm | | poor |
| 3d | Same as 3c, sieved | | (sieved fraction <44μm)[2] | | excellent |
| 4a | ethylmethacrylate, Du Pont Co., Elvacite ® 2041. unsieved | | too many particles larger than 100μm | | poor |
| 4b | Same as 4a, sieved | | (sieved fraction <62μm)[2] | | excellent |
| 5 | polyethylene, U.S.I. Chem. Co., Microthene ® | 36 | 13 | 1 | poor |
| 6a | cellulose acetate, Eastman Chem. Prod., Inc., unsieved | | too many particles larger than 100μm[3] | | poor |
| 6b | Same as 6a, sieved | | (sieved fraction <44μm)[2],[3] | | poor |
| 7 | PMMA acrylic resin Du Pont Co., Lucite ® 4F | 20 | 45 | 12 | poor |
| 8 | Ionomeric Resin, Du Pont Co., Surlyn ® 5000 | 10 | 23 | 1 | excellent |

[1] As analyzed by Coulter Counter ® Model T & TA, using a 140μm aperture (Coulter Electronics. Inc., Hialean, Fla.) Particles larger than 100μm cannot be analyzed with this aperture
[2] Particle size of sieved fraction, not analyzed in Coulter Counter ®
[3] Particles are not spheroidal in shape but are of various configurations.

EXAMPLE 2

Example 1 is repeated using a higher level of ionic polymer beads (1:3 toner:polymer) and as well as a lower level of ionic beads (3:1 toner:polymer) with satisfactory results. At both levels good quality images are produced with no streaking or mottle.

EXAMPLES 3-8

Example 1 is repeated using the inert polymeric beads shown below, the ratio of toner to beads being 1:1. In some cases, the bead particle sizes are too large to produce satisfactory results according to this invention. The toners containing these larger beads flow properly in the automatic toning device of Sandner, U.S. Pat. No. 4,087,279. However, these larger beads tend to remain on the image surface and produce visible "tents" when subsequent photopolymer layers are applied thereon in

EXAMPLE 9

The following ingredients are used to prepare a yellow toner:

| Ingredient | Amount (g) |
|---|---|
| Dalamar ® Yellow (Pigment Yellow 74, C.I. #11741 | 4,360.0 |
| Cellulose Acetate | 6,538.0 |
| Acetone | 27,669.6 |
| Water | 22,680.0 |
| Dimethylpolysiloxane described in Example 1, 1253.0 g/11 kg of toner | |

The toner is prepared in the same manner as described in Example 1 except that the milling time is 4 hours.

After the toner is dried, pulverized and surface treated with the dimethylpolysiloxane, it is mixed with an equal amount of the ionic polymer bead material described in Example 1 and is used to develop a photopolymer image by toning using the automatic toning device of Sandner, U.S. Pat. No. 4,087,279. A control toner (containing no polymer beads) is also used to tone a similar photopolymer image in the same toning device. The toner of the invention produces a good quality image which is unstreaked and has no mottle. The control toner produces an image that is streaked and has mottle.

EXAMPLE 10

The following ingredients were used to prepare a black toner:

| Ingredient | Amount (g) |
| --- | --- |
| Carbon Black, Sterling ® NS N774 (Pigment Black 7, C.I. #77266) | 6,300.0 |
| Cellulose Acetate | 6,300.0 |
| Acetone | 27,669.6 |
| Water | 22,680.0 |
| Dimethylpolysiloxane described in Example 1, 970.0 g/12.6 kg of toner | |

The toner is prepared in the same manner as described in Example 1.

After the toner is dried, pulverized and surface treated with the dimethylpolysiloxane, it is mixed with an equal amount of the ionic polymer bead material described in Example 1. For control purposes, a toner without bead material is prepared. Both toners are used to develop a photopolymer image by toning using the toning device described in Example 1. The toner of the invention produces a good quality image, while the control toner produces an image that is streaked and has mottle.

EXAMPLE 11

The following ingredients are used to prepare a magenta toner:

| Ingredient | Amount (g) |
| --- | --- |
| Quindo Magenta (Pigment Red 122, Allied Chemical Corp., Harmon Colors | 3,315.0 |
| Indo Brilliant Scarlet Toner (Pigment Red 123, C.I. #71145) | 1,560.0 |
| Cellulose Acetate | 6,929.0 |
| Acetone | 27,669.6 |
| Water | 22,680.0 |
| Dimethylpolysiloxane described in Example 1, 679.0 g/11.8 kg of toner | |

The toner is prepared in the same manner as described in Example 1. After the toner is dried, pulverized and surface treated with the dimethylpolysiloxane, it is mixed with an equal amount of the ionic polymer bead material described in Example 1 and is used to develop a photopolymer image using the toning device described in Example 1. A control toner containing no polymer beads is also used to tone a similar image in a similar manner. The toner of the invention produces a good quality image which is unstreaked and has no mottle, while the image prepared by using the control toner is streaked and has mottle.

EXAMPLE 12

A cyan toner similar to that described in Example 1 is prepared. After the toner is dried, pulverized and surface treated with the dimethylpolysiloxane as described in Example 1, it is divided into six samples. Five of the samples are mixed with equal amounts of polymethylmethacrylate beads of varying sizes (as determined by sieving). The control contains no polymethylmethacrylate beads. All toners are used to develop photopolymer images as described in Example 1 with the following results:

| Sample | Approx. Bead Size ($\mu$m) | Result |
| --- | --- | --- |
| Control | — | poor |
| A | >149 | poor |
| B | 106 to 149 | poor |
| C | 60 to 106 | fair to poor |
| D | 44 to 60 | good |
| E | <44 | excellent |

EXAMPLE 13

A black toner similar to that described in Example 10 is prepared. The toner is dried, pulverized and surface treated also as described in Example 10 and then is divided into two samples. Sample 1 (The Control) is used without further treatment. Sample 2 is further mixed with an equal amount of the ionic polymer bead material described in Example 1. Both toner samples are then used to develop a photopolymer image using an acrylic pad to apply the toner to the surface of the image. The pad is moved horizontally across the image surface until the entire area is covered and is then moved across the image vertically until the entire area is covered. No hand pressure is used. A cycle consists of a completed horizontal covering and a completed vertical covering. Twenty cycles insure a complete "toning" of the image areas. Both imaged samples are examined for streaks and mottle. The toner having the polymer beads produces a uniform, streak and mottle free image while the imaged toned with the Control toner has considerable mottle and streaks.

We claim:

1. Toner particles consisting essentially of an intimate mixture of (A) 25 to 75% by weight of substantially colorless, inert, nonelectroscopic, spheroidal shape polymer particles having size distribution in the range of greater than 5 to less than 60 micrometers, not more than 15% of the polymer particles being less than 10 micrometers and not more than 15% of the polymer particles being greater than 50 micrometers of equivalent spherical diameter the polymer particles being selected from the class consisting of polymethylmethacrylate, polyethylmethyacrylate, polyethylene, polyvinyl chloride and ionic copolymer of $\alpha$-olefins having the formula R—CH=CH$_2$ where R is a radical selected from the class consisting of hydrogen, alkyl of 1 to 8 carbon atoms, and $\alpha,\beta$-ethylenically carboxylic acids having from 3 to 8 carbon atoms, the copolymers having from 10% to 90% of the carboxylic acid groups ionized by neutralization with metal ions uniformly distributed throughout the copolymer, and (b) 75 to 25% by weight of colorant particles having a size distribution within the range of 0.5 to 5.0 micrometers and not more than 50 percent of the colorant particles being less than 1 micrometer particle size.

2. Toner particles according to claim 1 wherein the colorant particles are treated with a polysiloxane compound.

3. Toner particles according to claim 2 wherein the polysiloxane compound is dimethylpolysiloxane.

4. Toner particles consisting essentially of an intimate mixture of (A) 25 to 75% by weight of substantially colorless, inert, nonelectroscopic, spheroidal shape polymer particles having size distribution in the range of greater than 5 to less than 60 micrometers, not more than 15% of the polymer particles being less than 10 micrometers and not more than 15% of the polymer particles being greater than 50 micrometers of equivalent spherical diameter the spheroidal particles are an ionic copolymer of α-olefins having the formula R—CH=CH$_2$ where R is a radical selected from the class consisting of hydrogen, alkyl of 1 to 8 carbon atoms, and α,β-ethylenically carboxylic acids having from 3 to 8 carbon atoms, the copolymers having from 10% to 90% of the carboxylic acid groups ionized by neutralization with metal ions uniformly distributed throughout the copolymer, and (B) 75 to 25% by weight of colorant particles having a size distribution within the range of 0.2 to 30 micrometers and not more than 50 percent of the colorant particles being less than 1 micrometer particle size.

5. Toner particles according to claim 4 wherein the spheroidal particles have an average particle size of about 23 micrometers wherein not more than about 10% of the particles are less than 10 micrometers and not more than about 1% of the particles are greater than 50 micrometers.

6. Toner particles according to claim 4 wherein the colorant particles are treated with a polysiloxane compound.

7. Toner particles according to claim 6 wherein the polysiloxane compound is dimethylpolysiloxane.

* * * * *